United States Patent
Okabe et al.

(10) Patent No.: US 8,420,766 B2
(45) Date of Patent: Apr. 16, 2013

(54) BIOMASS-DERIVED EPOXY RESIN COMPOSITION

(75) Inventors: Yoshiaki Okabe, Hitachi (JP); Hiroyuki Kagawa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 254 days.

(21) Appl. No.: 12/843,979

(22) Filed: Jul. 27, 2010

(65) Prior Publication Data

US 2011/0024168 A1    Feb. 3, 2011

(30) Foreign Application Priority Data

Jul. 28, 2009  (JP) .................................. 2009-174885

(51) Int. Cl.
*C08G 59/68* (2006.01)

(52) U.S. Cl.
USPC ........................................................ 528/88

(58) Field of Classification Search ............... 528/88
See application file for complete search history.

(56) References Cited

U.S. PATENT DOCUMENTS

| | | | | |
|---|---|---|---|---|
| 3,984,363 A * | 10/1976 | D'Alelio | ..................... | 526/270 |
| 4,017,474 A * | 4/1977 | Glasser et al. | ................. | 530/502 |
| 4,367,326 A * | 1/1983 | Blount | .......................... | 527/303 |
| 4,405,725 A * | 9/1983 | Bernard et al. | ................ | 521/112 |
| 4,925,923 A * | 5/1990 | Yalpani et al. | ................. | 530/506 |
| 5,102,992 A * | 4/1992 | Glasser et al. | ................. | 530/502 |
| 5,382,608 A * | 1/1995 | Gardzielia et al. | .............. | 524/14 |
| 6,197,122 B1 * | 3/2001 | Ober et al. | .......................... | 134/2 |
| 8,075,637 B2 * | 12/2011 | Gizaw et al. | ..................... | 8/137 |
| 2006/0043629 A1 * | 3/2006 | Drzal et al. | .................... | 264/140 |
| 2006/0083766 A1 * | 4/2006 | Miyata et al. | .................. | 424/410 |
| 2008/0261136 A1 * | 10/2008 | Hongo et al. | ............... | 430/58.05 |
| 2009/0318632 A1 * | 12/2009 | Kurata et al. | .................. | 525/451 |
| 2010/0053511 A1 * | 3/2010 | Ohmuro et al. | ............... | 349/102 |
| 2010/0056705 A1 * | 3/2010 | Zhou et al. | ..................... | 524/555 |
| 2010/0075878 A1 * | 3/2010 | Gizaw et al. | ................... | 510/119 |
| 2010/0155122 A1 * | 6/2010 | Okabe et al. | ................... | 174/258 |
| 2010/0204368 A1 * | 8/2010 | Benko et al. | ..................... | 524/73 |
| 2010/0255315 A1 * | 10/2010 | Okabe et al. | ................... | 428/418 |
| 2011/0234952 A1 * | 9/2011 | Shi | ............................... | 349/117 |

FOREIGN PATENT DOCUMENTS

| | | |
|---|---|---|
| JP | 2005-199209 | 7/2005 |
| JP | 2005-255835 | 9/2005 |
| JP | 2010-150298 | 7/2010 |
| JP | 2010-163497 | 7/2010 |

OTHER PUBLICATIONS

English language machine translation of JP-2005-255835. Printed May 17, 2012. Original Japanses document published Sep. 22, 2005.*

Japanese office Action of Appln. No. 2009-174885 dated Oct. 25, 2011 with partial English translation.

* cited by examiner

*Primary Examiner* — Mark Eashoo
*Assistant Examiner* — Megan McCulley
(74) *Attorney, Agent, or Firm* — Antonelli, Terry, Stout & Kraus, LLP.

(57) ABSTRACT

A recyclable epoxy resin composition using a plant biomass in a resin skeleton and a cured material of the epoxy resin composition, and various types of products using them are provided. The epoxy resin composition comprises an epoxy resin; and a curing agent, wherein the curing agent is a biomass-derived acid anhydride having an acid anhydride bonded via an ester linkage to a biomass with a weight-average molecular weight of 300 to 5000.

14 Claims, 1 Drawing Sheet

US 8,420,766 B2

BIOMASS-DERIVED EPOXY RESIN COMPOSITION

CLAIM OF PRIORITY

The present application claims priority from Japanese Patent application serial No. 2009-174885, filed on Jul. 28, 2009, the content of which is hereby incorporated by reference into this application.

BACKGROUND OF THE INVENTION

1. Field of the Invention

The present invention relates to a recyclable biomass-derived epoxy resin composition.

2. Description of Related Art

The need to take international action against global warming has become urgent. Carbon-neutral products and recyclable products are expected from various fields to achieve the society which cuts the amount of carbon dioxide. Thermoplastic polylactic acid or bio-alcohol has been studied as the carbon-neutral product. As part of the study, lignin that is not effectively used yet has attracted attention. The lignin is a principal component of wood, and has a heat resistant structure with a polyphenol skeleton. The lignin content of wood is about 25%. The lignin constitutes an interpenetrating polymer network (IPN) together with cellulose which is contained in about 50% in the wood. The lignin is a complicated cross-linked polymeric compound, and is difficult to be separated off. For this reason, the lignin is defined as an obstacle interfering with production of the cellulose. Most of the lignin is treated as waste. However, the lignin has a heat resistant structure which is very rare among plant biomasses. In order to make effective use of such a structure, various techniques have been studied to extract the lignin in a high yield. Further, a low-molecular lignin has been developed. The application of the lignin as an insulating material by converting the lignin into an epoxy resin has been studied (see, for example, Japanese Patent Application Laid-Open No. 2005-199209 (Patent Document 1)).

In recycle technology, the recovery rate of used paper is 75%, and the recovery rate of metals from four kinds of electric household appliances based on home appliance recycling law is almost 100%. As to resin, however, only a thermoplastic resin is recycled by pelletization according to the home appliance recycle law. The recycle of a thermosetting resin such as an epoxy resin cured material has not been promoted. This is because the thermosetting resin is insoluble and infusible and thus requires much energy for depolymerization, which leads to the imbalance of the energy budget. In recent years, however, a depolymerization method is proposed which involves ester exchange of a thermosetting polymer containing many ester linkages with an alkali metal and an alcohol at normal pressure into a low-molecular weight compound (see, for example, Japanese Patent Application Laid-Open No. 2005-255835 (Patent Document 2)).

An example of recycling of epoxy resin from an acid anhydride-containing epoxy resin cured material is disclosed in Non-Patent Document 1 (Kao Min Tai, Research Committee of the Japan Society of Epoxy Resin Technology, Summary of Special Lecture by Recycle Committee (2000)).

SUMMARY OF THE INVENTION

A biomass-derived epoxy resin composition according to the present invention includes an epoxy resin and a curing agent. The curing agent is a biomass-derived acid anhydride having an acid anhydride bonded via an ester linkage to a biomass with a weight-average molecular weight of 300 to 5000.

The present invention can provide a biomass-derived epoxy resin composition which is a carbon-neutral thermosetting resin, and which can be easily recycled.

DETAILED DESCRIPTION OF THE PREFERRED EMBODIMENTS

Figure 1:
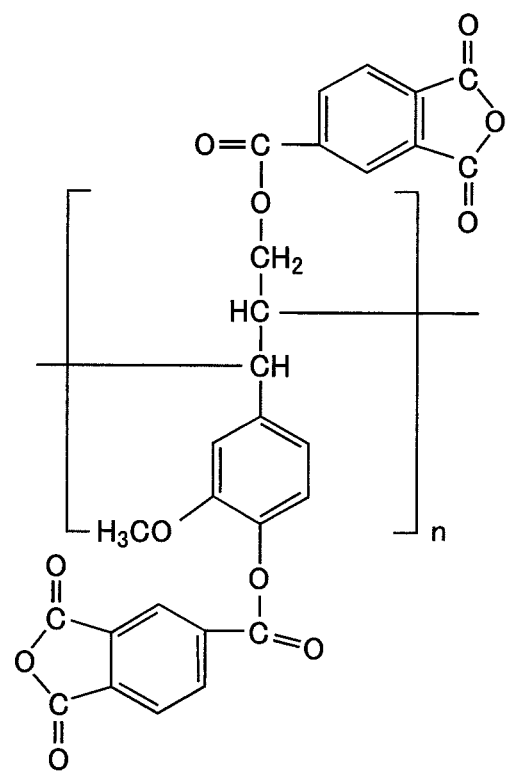
FIG. 1 shows a presumed structural formula of a lignin-derived acid anhydride.

We have thought that after a biomass-derived epoxy resin composition with a number of ester linkages is synthesized, a cured material of the thus-obtained epoxy resin composition is depolymerized, whereby the biomass of the raw material can be further recovered, and the recovered biomass can be used as the recyclable raw material for the epoxy resin composition.

It is an object of the present invention to provide a biomass-derived epoxy resin composition which is a carbon-neutral thermosetting resin and which can be easily recycled.

We have been dedicated to studying the above object, and have taken into consideration a phenolic hydroxy group and an alcoholic hydroxy group existing much in a biomass. And we have found that a biomass-derived acid anhydride via an ester bond (an ester linkage) is obtained by causing these hydroxyl groups to react with an acid chloride being an acid anhydride or an organic compound having carboxyl group. The reaction for obtaining the highly heat-resistant biomass-derived acid anhydride according to the present invention is called an esterification procedure. Herein, the acid chloride is defined as an organic compound with a functional group —CO—Cl and may be called an acyl chloride.

An epoxy resin cured material with a number of ester linkages can be obtained by curing the acid anhydride and the epoxy resin. When using the biomass as a raw material, the cured material exhibits the high heat resistance. The ester resin cured material has many ester linkages, and thus can be depolymerized by the above method (refer to Description of Related Art), whereby the biomass as the raw material can be recovered from a decomposition product. The present invention has been made based on the findings that the recovered biomass can be recycled in the form of the epoxy resin or cured material of the epoxy resin composition.

In general, the biomass used in an epoxy resin skeleton is characterized by a high heat resistance and a high decomposition temperature. Such a general epoxy resin cured material, however, is not easily depolymerized. This is because a chemical structure of the cured material does not have any bond which can be easily decomposed.

In contrast, the biomass-derived acid anhydride of the present invention is preferable. Except for the curing agent of the present invention, there is no biomass-derived acid anhydride which exhibits the high heat resistance.

The reason for this is based on the following.

A highly heat-resistant biomass-derived acid anhydride is conventionally obtained by converting the alcoholic hydroxy group contained in the biomass into a carboxyl group by an alcohol oxidation reaction, and dehydrating the carboxyl group thereafter. However, the phenolic hydroxyl group which is another hydroxyl group contained in the biomass is also oxidized in the alcohol oxidation reaction, and thus it is difficult to obtain a target substance. The above conventional reaction for obtaining the highly heat-resistant biomass-derived acid anhydride is called an oxidation and ring-closing procedure.

The biomass preferably includes a component selected from the group consisting of a low-molecular lignin, a lignophenol, a tannin and a kraft lignin.

The acid anhydride preferably includes a functional group —CO—Cl or a carboxyl group.

The epoxy resin preferably includes at least one of a biomass-derived epoxy resin including the biomass with an epoxy group bonded thereto, and a petroleum-derived epoxy resin.

The biomass-derived epoxy resin composition after being cured has a glass transition temperature of 150° C. or more.

A varnish comprises the biomass-derived epoxy resin composition; and a solvent for dissolving therein the epoxy resin composition, wherein a concentration of the epoxy resin composition is in a range of 0.5 to 95%.

In contrast, the present invention can synthesize a new acid anhydride based curing agent via an ester linkage from a biomass raw material. The biomass-derived epoxy resin cured material made using the acid anhydride based curing agent has a glass transition temperature of 180° C. or higher. The cured material can be used in an insulating layer for a motor, a printed board and a molding material, and as a base compound of a coating material, or the like.

When a product made of such a biomass-derived epoxy resin cured material is treated as waste and discarded, the depolymerization of the cured material can easily recover the biomass as raw material from the insulating layer. Specifically, the biomass can be recovered from the curing agent, and the biomass with diol end groups can also be recovered from the epoxy resin.

The recovered biomass has a phenolic hydroxyl group and an alcoholic hydroxyl group, and thus can serve again as a raw material for the curing agent and epoxy resin for making the epoxy resin composition.

According to the present invention, the hydroxyl groups of the biomass is added to the carboxyl group of the acid anhydride or the acid chloride via the ester linkages to form the curing agent, and the use of the curing agent can provide the epoxy resin cured material with the high heat resistance. The cured material has a number of ester linkages, and thus can be easily depolymerized by a conventional method. As the number of ester linkages included in the cured material becomes large, the depolymerization of the epoxy resin cured material is advantageously performed.

Non-Patent Document 1 discloses an example of recycling of the epoxy resin from the acid anhydride-containing epoxy resin cured material using a compound derived from oil. The acid anhydride epoxy resin cured material is added to xylene diamine, and then made soluble at 200° C. for 1 hour, whereby the epoxy resin cured material is depolymerized. The xylene diamine specifically serves as a solubilizing agent. As a result, the decomposed materials include diamine, polyol and xylene diamine, but the raw material cannot be obtained.

On the other hand, succinic acid, glutaric acid or the like is known as a biomass-derived compound. When such a compound is dehydrated, the succinic acid or glutaric acid is converted into succinic anhydride or glutaric anhydride, which serves as a curing agent of the epoxy resin. The succinic anhydride is obtained by dehydration of two carboxyl groups at both ends of an ethyl group. The glutaric anhydride is obtained by dehydration of two carboxyl groups at both ends of a propyl group. However, these acid anhydrides do not have an aromatic ring such as a benzene ring of a trimellitic anhydride. Hence, the cured material disadvantageously has a low glass transition temperature when the glutaric anhydride, for example, is used as the curing agent. Therefore, the acid anhydrides including the glutaric anhydride cannot be applied in the field of products requiring the heat resistance.

The present invention will be described in detail below.

The present invention is directed to a recyclable epoxy resin composition using a biomass-derived acid anhydride as a curing agent, and to a cured material thereof. The biomass-derived acid anhydride has an acid anhydride introduced into a biomass by an ester linkage.

The biomass-derived acid anhydride of the present invention is an acid anhydride with a cyclic group (an aromatic ring or a cyclic aliphatic group). The biomass-derived acid anhydride is an acid anhydride bonded to a hydroxyl group of the biomass via the ester linkage, and hence is used as the curing agent. In order to form the ester linkage, the acid anhydride is preferably a carboxylic acid derivative, and more preferably an acid chloride. Specifically, the acid anhydride is trimellitic anhydride chloride. It is apparent that the ester linkage can also be obtained by a dehydration reaction between a carboxylic acid containing trimellitic anhydride and a hydroxyl group.

The biomass-derived epoxy resin composition includes an epoxy resin, a curing agent and a curing accelerator. In some cases, a solvent, a flame retardant, an inorganic filler, a dye, a colorant, a leveling agent, an antifoamer and the like can be contained if necessary.

In the present invention, the term "biomass" as used therein means an organic resource originated from a contemporary biotic composition, and includes animal one and plant one. In the present invention, the plant biomasses are preferable. The plant biomasses include wood, chip thereof, and various kinds of grasses or rice straws. These biomasses have different structures depending on the kind of the biomass, but each contains cellulose, lignin and hemicellulose. Especially, the lignin having a polyphenol skeleton with a heat resistant structure is expected to be capable of being used in place of a petroleum-derived resin.

In the present invention, the lignin is used as the plant biomass. Specifically, the lignins in use include a low-molecular lignin (hereinafter abbreviated as L) extracted from a scrap wood with alcohol after applying a steam explosion treatment to the scrap wood, and a lignophenol (hereinafter abbreviated as LP) which is composed of lignin with cresol added thereto. A weight-average molecular weight (hereinafter abbreviated as MW) of the L or LP is preferably in a range of 300 to 5000 in terms of polystyrene.

For a MW exceeding 5000, the above biomass has a melting point of 180° C. or more. In application of the biomass to the epoxy resin composition, the melting point or melting viscosity of the epoxy resin composition tends to become high in a general curing temperature range (for example, of 100 to 200° C.), which causes problems regarding the curing property and moldability. For a MW less than 350, the biomass has a monofunctional hydroxyl group, which cannot provide an epoxy resin cured material with excellent heat resistance.

The L and LP include a phenolic hydroxyl group and an alcohol hydroxyl group. The L has a hydroxyl equivalent (hereinafter abbreviated as HE) of 107 g/eq, and the LP has the HE of 160 g/eq.

The biomass-derived epoxy resin, for example, an epoxidized lignin (hereinafter abbreviated as EL) is synthesized in the following way.

In a 2-liter four-neck flask equipped with stirring blades, a condenser and a thermometer were placed 100 grams of a low-molecular-weight lignin and 300 grams of a 10% aqueous tetramethylammonium hydroxide solution, followed by stirring for 30 minutes to give a solution.

The solution was further combined with 300 grams of epichlorohydrin, and the mixture was heated under reflux on an oil bath at 120° C. for one hour. The reaction mixture was cooled to room temperature, placed in a separating funnel, and washed with pure water until the oil layer became neutral.

After removing water therefrom, the residue was combined with 50 grams of a 20% aqueous tetramethylammonium hydroxide solution and heated under reflux at 120° C. for one hour, followed by washing with water.

This was placed in a rotary evaporator, from which about 80% of epichlorohydrin, water and by-products were evaporated and removed, the residue was placed in 2 liters of ethyl alcohol and thereby yielded white precipitates.

Ethyl alcohol was used herein, but another alcohol such as methyl alcohol, propyl alcohol, butyl alcohol, pentyl alcohol or hexyl alcohol may be used.

The precipitates were collected by filtration, dried in vacuo, and thereby yielded an epoxidized low-molecular-weight lignin EL.

The epoxidized low-molecular-weight lignin EL gave peaks at 2.6 ppm and 2.8 ppm through proton nuclear magnetic resonance spectroscopy ($^1$H-NMR) and gave an absorption at 914 cm$^{-1}$ through FT-IR, verifying that epoxy groups have been introduced (added) to lignin.

The epoxidized low-molecular-weight lignin EL according to this example was prepared in a yield of 106 grams and had a weight-average molecular weight Mw' of 2800. This was satisfactorily dissolved in an equivalent weight of 2-methoxyethanol (2MOE). The aqueous tetramethylammonium hydroxide solution had a pH of 12.9. As used herein "pH" refers to a hydrogen ion concentration.

Alternatively, an epoxidized lignophenol (hereinafter abbreviated as ELP) is also synthesized using the LP in the same way.

That is, an epoxidized lignophenol ELP was prepared through synthesis by the above-mentioned procedure of the EL, except for using a lignophenol and an aqueous calcium carbonate solution having a pH of 11.8.

ELP was prepared in a yield of 102 grams, had a weight-average molecular weight Mw' of 7600, and was soluble in 2MOE. The introduction of epoxy groups into lignophenol was confirmed through 1H-NMR and FT-IR analyses.

Further alternatively, a conventionally petroleum-derived epoxy resin can also be used.

The petroleum-derived epoxy resin is not limited to a specific one as long as it has an epoxy group in a molecule. For example, the petroleum-derived epoxy resins include EL, ELP, a bisphenol A type epoxy resin, a bisphenol F glycidyl ether type epoxy resin, a bisphenol S glycidyl ether type epoxy resin, a bisphenol AD glycidyl ether type epoxy resin, a phenol novolac type, cresol novolac type epoxy resin, 3,3', 5,5'-tetramethyl-4,4'-dihydroxybipheny glycidyl ether type epoxy resin, and the like.

The curing agent is preferably one made by bonding the acid chloride with the acid anhydride of the present invention to the biomass via the ester linkage. The acid chloride with the acid anhydride is obtained by a reaction between a carboxylic acid and a chlorinating agent. The chlorinating agents include thionyl chloride, phosphorus pentachloride, and phosphorous trichloride. Among them, the thionyl chloride is preferable. The acid anhydride is preferably trimellitic anhydride or pyromellitic anhydride, and more preferably trimellitic anhydride. The acid chloride is synthesized by stirring a mixture of the acid anhydride and the thionyl chloride at room temperature. The excess thionyl chloride can be removed by distillation under reduced pressure. Further, the ester can be formed by a dehydration reaction between the hydroxyl group of the biomass, and the carboxylic acid, which is, for example, the trimellitic anhydride.

The curing accelerator is one or a combination of two or more of the known curing accelerators generally used, and can be contained in the epoxy resin composition of the present invention if necessary. The curing accelerators can include tertiary amine compounds, imidazoles, organic sulfines, phosphorous compounds, tetraphenylboron salts, and derivatives thereof. The content of curing accelerator is not limited to a specific one as long as the accelerator can achieve a curing accelerating effect.

Solvents for making resin varnish include toluene, xylene, benzene, N-methylpyrrolidone, dimethylformamide, γ-butyrolactone, methylene chloride, carbon tetrachloride, chloroform, methyl ethyl ketone, methyl isobutyl ketone, 2-methoxyethanol, diethyl ether, ethylene glycol monomethyl ether, cyclohexanon, dimethylformamide, acetonitrile, methyl acetate, ethyl acetate, butyl acetate, acetone, tetrahydrofuran, and the like. One or a combination of two or more of the above solvents can be contained.

One or a combination of two or more of the known coupling agents can be contained in the epoxy resin composition of the present invention if necessary. The coupling agents can include epoxy silane, aminosilane, ureido silane, vinylsilane, alkylsilane, organic titanate, aluminum alkylate, and the like.

Flame retardants include red phosphorus, phosphoric acid, phosphate ester, a compound having a triazine ring such as melamine and a melamine derivative, a nitrogen-containing compound such as a cyanuric acid derivative or an isocyanuric acid derivative, a phosphorus-nitrogen containing compound such as a cyclophosphazene, a metal compound such as zinc oxide, iron oxide, molybdenum oxide, or ferrocene, antimony oxide such as antimony trioxide, antimony tetroxide or antimony pentoxide, a bromo-epoxy resin and the like. One or a combination of two or more of the above flame retardants can be contained.

An inorganic filler generally used may be mixed into the epoxy resin composition of the present invention. The inorganic filler is contained in the resin composition so as to improve the moisture absorbency, heat conductivity and strength, and to reduce a thermal expansion coefficient. Specifically, the inorganic filler includes powder made of a molten silica, a crystalline silica, alumina, zircon, calcium silicate, calcium carbonate, potassium titanate, silicon carbide, silicon nitride, aluminum nitride, boron nitride, beryllia, zirconia, zircon, fosterite, sterite, spillel, mullite or titania, or a spherical bead thereof, or a glass fiber.

Inorganic fillers having the adequate flame-retardant effect include aluminum hydroxide, magnesium hydroxide, zinc silicate, zinc molybdate and the like. These inorganic fillers may be used singly or in a combination of two or more kinds thereof. Further, other resins may be added to the epoxy resin composition if necessary.

The epoxy resin composition of the present invention can contain an ion trapper agent for improving the moisture resistance of electronic devices, and the high-temperature exposure property (heat resistance). The ion trapper agent is not limited to a specific kind, and hence the known material can be used as the ion trapper agent. Specifically, the ion trapper agents include a hydrotalcite, and a hydrous oxide of an element such as magnesium, aluminum, titanium, zirconium or bismuth. These ion trapper agents may be used singly or in a combination of two or more kinds thereof.

The components (materials) of the epoxy resin composition of the present invention may be mixed together by any other means as long as the means can uniformly disperse the premix the components. In general, after measuring the predetermined amounts of the respective components, these components are dispersed and mixed by a mixing roll, a ball mill, a triple roll mill, a vacuum kneader, a pot mill, a hybrid mixer, and the like.

The biomass-derived epoxy resin cured material of the present invention can be obtained by curing the epoxy resin composition including the above components by an arbitrary method. The curing is preferably performed on curing conditions, for example, in a range of temperature of 50 to 250° C. The depolymerization of the anhydride-based epoxy resin cured material is performed according to Patent Document 2.

The biomass-derived epoxy resin cured material is decomposed by heating using a process liquid containing an alkali metal compound and an organic solvent. The alkali metal compound of the process liquid includes a compound containing an alkali metal such as lithium, sodium, potassium or cesium, and a hydride, a hydroxide and a chloride of lithium, sodium, potassium, cesium and the like. The solvents of the process liquid include an amide-based, an alcohol-based, an ether-based and an ester-based ones. Among them, the alcohol-based solvent is preferable because of a high decomposition effect by the ester exchange. Actually, the process liquid containing 1000 g of the solvent was added to 10 g of the cured material having a grain size of about 100 μm with respect to 1.0 equivalent (0.336 mol) of the alkali metal compound. Then, the solution was strongly stirred at normal pressure at a process temperature of 100 to 250° C. for a process time of 6 to 46 hours by a high-speed vibrating sample mill (TI-100, manufactured by Heiko Seisakusho, Ltd.), whereby the cured material was depolymerized.

EXAMPLES

Examples of the present invention will be described below. The following will describe abbreviations or trade names and contents of materials used in Examples.

ATMC: trimellitic anhydride chloride (manufactured by Wako Pure Chemical Industries, Ltd.)

NMP: N-methylpyrrolidone, boiling point of 203° C. (manufactured by Wako Pure Chemical Industries, Ltd.)

AG: glutaric anhydride, melting point of 52° C. (manufactured by Wako Pure Chemical Industries, Ltd.)

ESCN: o-cresol novolac epoxy resin, trade name: ESCN-190, epoxy equivalent (hereinafter abbreviated as EEW) of 195 g/eq (manufactured by Sumitomo Chemical Co., Ltd.)

Bis A: bisphenol A epoxy resin, trade name: jER828, EEW of 195 g/eq (manufactured by Japan Epoxy Resin Co., Ltd.)

Bis F: bisphenol F epoxy resin, trade name: RE404S, EEW of 165 g/eq (manufactured by Nippon Kayaku Co., Ltd.)

P200: imidazole curing accelerator, softening temperature of 97° C. (manufactured by Japan Epoxy Resin Co., Ltd.)

AL: L-derived anhydride/anhydride obtained from L and ATMC (presumed structure shown in FIG. 1), Mw 1450

ALP: LP-derived anhydride/anhydride obtained from LP and ATMC, Mw 2600

L': L obtained by depolymerizing cured material (Mw 3200)

LP': LP obtained by depolymerizing cured material Mw 4600

MEK: methyl ethyl ketone (manufactured by Wako Pure Chemical Industries, Ltd.)

MOE: 2-methoxyethanol (manufactured by Wako Pure Chemical Industries, Ltd.)

BA: benzyl alcohol (manufactured by Wako Pure Chemical Industries, Ltd.)

KBM403: γ-Glycidoxypropyltrimethoxysilane (manufactured by Shin-Etsu Chemical Co., Ltd.)

A storage elastic modulus (E') and a loss elastic modulus (E") (at a rate of temperature increase of 5° C./min) of a cured material film are determined by a dynamic viscoelasticity measurement device (DMA: dynamic mechanical analysis). A tan δ which is the ratio of the loss elastic modulus to the storage elastic modulus is determined. And the glass transition temperature is thus determined from a temperature at which the tan δ takes a peak.

A volume resistivity is measured using a manufactured copper-clad laminate according to the JIS K6911.

Example 1

(1) Synthesis of Lignin-Derived Anhydride

First, 3.0 g of dried trimellitic anhydride chloride (0.0143 mol) and 10 g of NMP were introduced into a flask, and stirred and mixed in the flask. Then, 2.0 g of dried L (HE 107 g/eq, 0.019 mol) was added to and dissolved in the mixture. Then, 1.2 g of pyridine (0.015 mol) was added thereto in 20 minutes. After delivering the pyridine by drops into the solution, the solution was stirred for 8 hours at a temperature of liquid of 20° C. Thereafter, the solution was filtered under reduced pressure thereby to remove a pyridine hydrochloride, so that the L bonded to the acid anhydride via the ester linkage (hereinafter abbreviated as AL) was obtained. The presumed structure of the L-derived acid anhydride is shown in FIG. 1.

(2) Curing of Epoxy Resin Composition

First, 2 g of EL (EEW 380 g/eq) as epoxy resin and the AL obtained in the above (1) were mixed in the stoichiometric proportion, and 2% by weight of a curing accelerator P200 relative to the total weight of the resin was added thereto to form a resin varnish. The resin varnish was applied to a polyimide film and was thermally-cured, which produced an epoxy resin cured film of 100 to 200 μm in thickness. The curing conditions were as follows: 60° C./1 hour+120° C./1 hour/160° C./1 hour+200° C./1 hour.

Table 1 shows the composition of the epoxy resin cured material thus obtained, and the glass transition temperature indicative of heat resistance of the cured material. The glass transition temperature of the cured material was 200° C.

TABLE 1

Composition of biomass-derived epoxy resin cured material, and glass transition temperature of cured material

| No. | Epoxy resin | Curing agent | Curing accelerator | Final curing temperature (° C.) | Glass transition temperature (° C.) |
|---|---|---|---|---|---|
| Example 1 | EL | AL | P200 | 200 | 200 |
| Example 2 | ESCN | AL | " | " | 200 |
| Example 3 | Bis A | AL | " | " | 196 |
| Example 4 | ELP | ALP | " | " | 205 |
| Example 5 | ESCN | ALP | " | " | 210 |
| Example 6 | Bis A | ALP | " | " | 198 |
| Example 7 | ESCN + Bis A | AL | " | " | 195 |
| Example 8 | EL + | ALP | " | " | 200 |

TABLE 1-continued

Composition of biomass-derived epoxy resin cured material, and glass transition temperature of cured material

| No. | Composition | | | Final curing temperature (° C.) | Glass transition temperature (° C.) |
|---|---|---|---|---|---|
| | Epoxy resin | Curing agent | Curing accelerator | | |
| Example 9 | ESCN EL | L' | " | " | 180 |
| Example 10 | ELP | LP' | " | " | 175 |
| Comparative example 1 | EL | AG | " | " | 152 |
| Comparative example 2 | ELP | AG | " | " | 153 |
| Comparative example 3 | ESCN | AG | " | " | 150 |
| Comparative example 4 | Bis A | AG | " | " | 130 |

Examples 2 to 8

Cured materials in Examples 2 to 8 were made in the manner according to Example 1. The glass transition temperature of each cured material was measured. The epoxy resin in each of Examples 7 and 8 was in a binary mixing system in which two components were mixed in an equimolar amount. As shown in Table 1, the result was that the glass transition temperature of each cured material was in a range of 185 to 210° C.

Example 9

In Example 9, the epoxy resin cured material used in Example 1 was decomposed with the process liquid to obtain a raw material L.

The process liquid was prepared by adding 4 g of caustic soda to 100 g of benzyl alcohol. Then, 1 g of the epoxy resin cured material used in Example 1 was introduced into the above process liquid and heated at 100 to 200° C. for 5 to 20 hours thereby to be depolymerized. Further, 2 g of water was added to the liquid, and then the solution was heated at 100° C. for minutes. The decomposed solution was cooled at room temperature, and acetic acid was added to the solution so as to adjust the pH of the solution to 4 to 7, whereby a precipitate was filtered out. Then, the precipitate was cleaned with hot isopropyl alcohol (at 80° C.), and then cleaned with hot water, whereby a raw material L was recovered. The L had a HE of 97 g/eq, and a MW of 1500. By using the L as the curing agent, the cured material composed of the epoxy resin composition of Example 9 was obtained. The epoxy resin cured material of Example 9 had a glass transition temperature of 180° C.

Example 10

A LP was obtained in the manner according to Example 9. The LP had a HE of 180 g/eq and a MW of 4500. By using the LP as the curing agent, an epoxy resin composition and its cured material of Example 10 were obtained. The epoxy resin cured material had a glass transition temperature of 175° C. It has been found that the epoxy resin cured material made of the biomass-derived acid anhydride of the present invention can be polymerized to recover the biomass, which can further be used for a next curing agent again.

Comparative Examples 1 to 4

Table 1 also shows both epoxy resin compositions made by using a biomass-derived acid anhydride adding AG as a curing agent, and glass transition temperatures of cured materials of the epoxy resin compositions. The glass transition temperature of each cured material was in a range of 130 to 153° C. The cured materials of Comparative Examples are obviously found to have the low glass transition temperature, as compared to the cured materials made of AL or ALP of Examples, which is the biomass-derived acid anhydride of the present invention.

Example 11

Fabrication of Laminate

MEK/MOE (in an equimolar amount) was added to the composition of Example 1 shown in Table 1 thereby to obtain a varnish having an NV (solid content concentration) of 50%

A glass nonwoven fabric (having a size of 30 cm square) was impregnated with the varnish, and then the solvent was removed by a blow-dryer (125° C./9 minutes) thereby to obtain prepreg in a B-stage state. Seven pieces of the prepreg thus obtained were superimposed on each other, and were cured via copper foils of 35 μm in thickness on the upper and lower sides of the prepreg by a hydraulic vacuum hot press using mirror plates, cushion paper, and exfoliate paper at a surface pressure of 4 MPa, at a temperature of room temperature to 200° C. (a temperature increase speed of 5° C./min), and then at 200° C. for 1 hour, thereby to obtain a copper-clad laminate. The laminate had a glass transition temperature of 202° C., and a volume resistivity of $1 \times 10^{15}$ Ω·cm or more.

Example 12

First, 80 g of Bis F, 20 g of EL, 40 g of AL as a curing agent, 4.2 g of KBM403 as a coupling material, and the following three kinds of high-purity spherical fillers (at a combination ratio of a/0.6:b/0.3:c/0.1) were mixed. Then, the mixture was added in 50% by volume to the above resin.

a: SP-4B, average particle diameter of 5.1 μm (manufactured by Fuso Chemical Co., Ltd.)

b: QS4F2, average particle diameter of 4.6 μm (manufactured by Mitsubishi Rayon Co., Ltd.)

c: SO25R, average particle diameter of 0.68 μm (manufactured by Tatsumori Ltd.)

Further, 4.2 g of an ion trapper, for example, IWE500 (trade name) (manufactured by Toagosei Co., Ltd.) was added.

Figure 2:
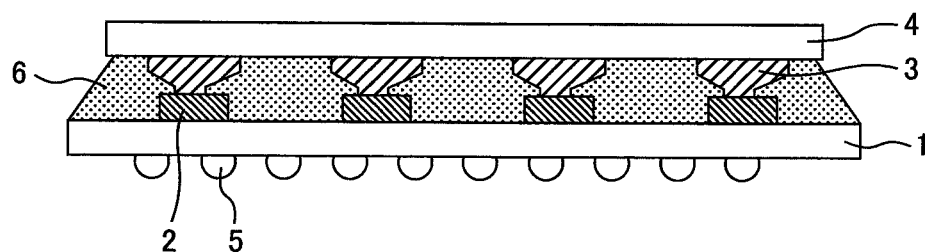
FIG. 2 is a schematic cross-sectional view illustrating a FC-BGA used in Example 12.

The mixture was mixed by a triple roll, and thereafter by a vacuum kneader to thereby produce a resin sealant. The above resin sealant was used for a FC-BGA (Flip Chip-Ball Grid Array) shown in FIG. 2. In bonding a chip to a substrate, a solder bump gap was 100 μm, and a bump pitch was 150 μm. These elements were sealed with the above resin sealant by a capillary flow method. A sealing temperature was 195° C.

In this way, the AL of the present invention can also be suitable for use as a resin sealer for a semiconductor.

What is claimed is:

1. A method for manufacturing a plant-based biomass-derived epoxy resin composition comprising an epoxy resin; and a curing agent which is a biomass-derived acid anhydride having an acid anhydride bonded via an ester linkage to a biomass with a weight-average molecular weight of 300 to 5000, the method comprising the steps of:

depolymerizing a cured material of the biomass-derived epoxy resin composition by using an alkali metal compound to obtain a recovered biomass, the cured material having a glass transition temperature of 150° C. or more, and using the recovered biomass as a raw material for a curing agent and/or an epoxy resin again, the recovered biomass having a phenolic hydroxyl group and an alcoholic hydroxyl group.

2. The method for manufacturing a biomass-derived epoxy resin composition according to claim 1, wherein the biomass is lignin.

3. The method for manufacturing a biomass-derived epoxy resin composition according to claim 2, wherein the epoxy resin is epoxidized lignin.

4. The method for manufacturing a biomass-derived epoxy resin composition according to claim 1, wherein the biomass is lignophenol.

5. The method for manufacturing a biomass-derived epoxy resin composition according to claim 4, wherein the epoxy resin is epoxidized lignophenol.

6. The method for manufacturing a biomass-derived epoxy resin composition according to claim 1, wherein the recovered biomass is lignin.

7. The method for manufacturing a biomass-derived epoxy resin composition according to claim 1, wherein the recovered biomass is lignophenol.

8. A method for manufacturing a plant-based biomass-derived epoxy resin composition comprising steps of:

forming a cured material of a biomass-derived epoxy resin composition including an epoxy resin and a curing agent, wherein the curing agent is a biomass-derived acid anhydride having acid anhydride bonded via ester linkage to a biomass with a weight-average molecular weight of 300 to 5000;

depolymerizing the cured material of the biomass-derived epoxy resin composition by using an alkali metal compound to obtain a recovered biomass; and reusing the recovered biomass as a raw material for a regenerated curing agent and/or a regenerated epoxy resin, the recovered biomass having a phenolic hydroxyl group and an alcoholic hydroxyl group.

9. The method for manufacturing a biomass-derived epoxy resin composition according to claim 8, wherein the biomass is lignin.

10. The method for manufacturing a biomass-derived epoxy resin composition according to claim 9, wherein the epoxy resin is epoxidized lignin.

11. The method for manufacturing a biomass-derived epoxy resin composition according to claim 8, wherein the biomass is lignophenol.

12. The method for manufacturing a biomass-derived epoxy resin composition according to claim 11, wherein the epoxy resin is epoxidized lignophenol.

13. The method for manufacturing a biomass-derived epoxy resin composition according to claim 8, wherein the recovered biomass is lignin.

14. The method for manufacturing a biomass-derived epoxy resin composition according to claim 8, wherein the recovered biomass is lignophenol.

* * * * *